(12) United States Patent
Partridge et al.

(10) Patent No.: US 7,172,917 B2
(45) Date of Patent: Feb. 6, 2007

(54) METHOD OF MAKING A NANOGAP FOR VARIABLE CAPACITIVE ELEMENTS, AND DEVICE HAVING A NANOGAP

(75) Inventors: Aaron Partridge, Palo Alto, CA (US); Markus Lutz, Sunnyvale, CA (US); Thomas Kenny, San Carlos, CA (US)

(73) Assignees: Robert Bosch GmbH, Stuttgart (DE); The Board of Trustees of the Leland Stanford Junior University, Palo Alto, CA (US)

(*) Notice: Subject to any disclaimer, the term of this patent is extended or adjusted under 35 U.S.C. 154(b) by 0 days.

(21) Appl. No.: 10/418,617

(22) Filed: Apr. 17, 2003

(65) Prior Publication Data

US 2004/0209435 A1 Oct. 21, 2004

(51) Int. Cl.
*H01L 21/20* (2006.01)
(52) U.S. Cl. .............. 438/50; 438/52; 438/53
(58) Field of Classification Search ........... 438/52, 438/53, 51, 50
See application file for complete search history.

(56) References Cited

U.S. PATENT DOCUMENTS

| | | | |
|---|---|---|---|
| 5,093,594 A * | 3/1992 | Mehregany | 310/82 |
| 5,818,683 A | 10/1998 | Fujii | |
| 5,894,091 A | 4/1999 | Kubota | |
| 5,895,851 A | 4/1999 | Kano et al. | |
| 5,922,212 A | 7/1999 | Kano et al. | |
| 6,034,414 A | 3/2000 | Lin | |
| 6,066,536 A | 5/2000 | Lin | |
| 6,159,762 A * | 12/2000 | Scheiter et al. | 438/53 |
| 6,162,657 A | 12/2000 | Schiele et al. | |
| 6,210,988 B1 | 4/2001 | Howe et al. | |

(Continued)

FOREIGN PATENT DOCUMENTS

WO    WO 01/77008    10/2001

(Continued)

OTHER PUBLICATIONS

Wan-Thai Hsu et al., "A sub-micron capacitive gap process for multiple-metal-electrode lateral micromechanical resonators," IEEE Int. Micro Electro Mechanical Conf., Interlaken, Switzerland, Jan. 21-25, 2001, pp. 349-352.

(Continued)

*Primary Examiner*—Michael Trinh
(74) *Attorney, Agent, or Firm*—Kenyon & Kenyon LLP (57) ABSTRACT

A method for fabricating a variable capacitive device including providing a base silicon-bearing compound electrode which is vertically-inclined with respect to a substrate, depositing a sacrificial layer on the base electrode, depositing a silicon-bearing compound electrode on the sacrificial layer which is also vertically-inclined with respect to the substrate, and removing the sacrificial layer from between the base silicon-bearing compound electrode and the grown silicon-bearing compound electrode. A variable capacitive device having a fixed vertically-inclined silicon-bearing compound electrode and a movable vertically-inclined silicon-bearing compound electrode produced by arranging a sacrificial layer on a base silicon-bearing compound electrode, depositing a grown silicon-bearing compound electrode on the sacrificial layer, and etching the sacrificial layer. Between the fixed silicon-bearing compound and the movable silicon-bearing compound electrode is a nanogap, the nanogap having a uniform width.

28 Claims, 5 Drawing Sheets

U.S. PATENT DOCUMENTS

| | | |
|---|---|---|
| 6,211,098 B1 * | 4/2001 | Twu et al. ............... 438/787 |
| 6,229,684 B1 | 5/2001 | Cowen et al. |
| 6,242,989 B1 | 6/2001 | Barber et al. |
| 6,249,073 B1 | 6/2001 | Nguyen et al. |
| 6,251,699 B1 * | 6/2001 | Fuertsch et al. ........... 438/50 |
| 6,318,175 B1 | 11/2001 | Muchow et al. |
| 6,362,018 B1 | 3/2002 | Xu et al. |
| 6,367,252 B1 | 4/2002 | Hill et al. |
| 6,393,913 B1 * | 5/2002 | Dyck et al. ............ 73/504.12 |
| 6,402,968 B1 | 6/2002 | Yazdi et al. |
| 6,413,793 B1 | 7/2002 | Lin et al. |
| 6,440,816 B1 * | 8/2002 | Farrow et al. ............ 438/401 |
| 6,461,888 B1 * | 10/2002 | Sridhar et al. ............. 438/52 |
| 6,628,177 B2 * | 9/2003 | Clark et al. ............... 333/186 |
| 6,743,654 B2 * | 6/2004 | Coffa et al. ................ 438/52 |
| 6,808,954 B2 * | 10/2004 | Ma et al. ................... 438/51 |
| 2002/0070816 A1 | 6/2002 | Hsu et al. |
| 2002/0105393 A1 | 8/2002 | Clark et al. |
| 2002/0151100 A1 | 10/2002 | Coffia et al. |

FOREIGN PATENT DOCUMENTS

| | | |
|---|---|---|
| WO | WO 01/77009 | 10/2001 |

OTHER PUBLICATIONS

Yongduk Kim et al., "Design of the RF-MEMS voltage tunable capacitor for wide tunable range", Dept. of Electrical Engineering, Kyungpook National University, South Korea, 8 pages, no date.

Bruno Murari et al., "MEMS, a New Discipline for Silicon Technology", STMicroelectronics, Via Tolomeo, 1, 20100 Cornaredo (Milano), Italy, 6 pages, no date.

* cited by examiner

METHOD OF MAKING A NANOGAP FOR VARIABLE CAPACITIVE ELEMENTS, AND DEVICE HAVING A NANOGAP

FIELD OF THE INVENTION

The present invention relates to capacitive elements used in microelectromechanical systems (MEMS), and relates more particularly to variable capacitive elements having narrow lateral inter-electrode gaps and a method for producing such variable capacitive elements.

BACKGROUND INFORMATION

Variable capacitive elements are used in MEMS as components of microelectronic devices including sensors, actuators and resonators. With respect to sensors, such as movement sensors, micromechanical variable capacitive elements can form a component for detection because their capacitance is sensitive to changes in position. With respect to actuators microelectromechanical capacitive elements can form force transducers.

The effectiveness and performance of variable capacitive elements in a number of different applications is often a function of the magnitude of the equilibrium gap distances (widths) between fixed and movable electrodes. Further improvements in the effectiveness of such elements requires either a reduction in the gap width or an increase in electrode surface area to boost capacitance, or both.

In conventional microfabrication techniques for producing variable capacitive elements, the surfaces of electrodes in variable capacitive elements are formed directly onto a silicon structure by a lithographic patterning process followed by an etching process in which vertical edges are defined and etched into a continuous field of silicon. In these techniques, the minimum gap width and width tolerances are usually determined by lithography and etching limits. For example, epitaxial polysilicon and switched plasma etching, as developed by Robert Bosch GmbH, allows etch depths (electrode thicknesses) of 10–50 microns, and gap widths of on the order of a micron.

An article by W. T. Hsu, J. R. Clark, and L. T.-C. Nguyen, entitled "A Sub-Micron Capacitive Gap Process for Multiple-Metal-Electrode Lateral Micromechanical Resonators," in *Technical Digest*, IEEE International MEMS Conference (January 2001) discusses a process for fabricating capacitive structures that combines polysilicon surface micromachining, metal electroplating, sacrificial etching, and a side-wall sacrificial-spacer technique to achieve high-aspect-ratio, submicron capacitive gaps (hereinafter referred to as "the Nguyen process").

U.S. Pat. No. 6,249,073 to Nguyen et al. discusses a method of producing high frequency resonators using polysilicon surface micromachining technology. These processes suffer from several disadvantages, including diverse materials which may prevent use of some semiconductor fabrication equipment. Additionally, owing to the metal plating steps in the Nguyen process, capacitive elements produced according to this process will necessarily include a metal electrode (for each electrode pair). Use of a metal electrode often presents material compatibility problems. For example, MEMS-CMOS (Complementary Metal Oxide Semiconductor) integration options are limited thereby because metal makes post-MEMS-CMOS integration impossible and may limit intra-MEMS and pre-MEMS-CMOS integration. Inclusion of metals usually also precludes post-fabrication high-temperature processing. In addition, metal electrodes may experience plastic deformation or substrate adhesion failure when subject to electrostatic forces.

The Nguyen process is not amenable to forming epitaxial silicon structures. Thus, the Nguyen process may not benefit from both the high-aspect-ratio structures and reduced gap widths made possible by employing epipoly and switched-plasma etching.

Small, precise gaps may also be useful in other MEMS. For instance, high frequency MEMS resonators may require gap distances of submicron dimensions. Therefore, what is needed is a method for producing uniform narrow gaps between silicon elements.

SUMMARY OF THE INVENTION

The present invention provides a vertically-inclined variable capacitive element including a vertically-inclined fixed silicon electrode and a vertically-inclined movable silicon electrode which may be movable in a lateral direction with respect to the fixed electrode. A nanogap may be arranged between the fixed and movable electrodes that may be between approximately, for example, 1 and 1000 nanometers when the movable electrode is in an equilibrated position with respect to the fixed electrode.

According to an exemplary embodiment, the movable electrode is made from either polysilicon or single-crystal silicon on oxide and the fixed electrode is made from polysilicon or single-crystal silicon.

In an exemplary embodiment, the present invention also provides a microelectromechanical device including at least two silicon components separated by a uniform nanogap which may be approximately one to one thousand nanometers in width.

In an exemplary embodiment, the present invention provides a method for fabricating a variable capacitive element having an inter-electrode nanogap in which a sacrificial layer is arranged between a fixed vertically-inclined silicon electrode and a movable vertically-inclined silicon electrode. The sacrificial layer has a thickness of approximately 1 to 1000 nanometers. The sacrificial layer between the fixed silicon electrode and the movable silicon electrode may then be etched away, leaving a nanogap between the fixed and movable electrodes.

According to an exemplary embodiment, the variable capacitive element may be fabricated within an epitaxial reactor environment. According to one implementation, the sacrificial layer may be composed of silicon dioxide.

According to an exemplary embodiment, before the sacrificial layer is arranged, material in a first silicon layer may be etched to define the movable silicon electrode. The sacrificial layer may be grown or deposited on the movable silicon electrode, a second silicon layer may be deposited over the sacrificial layer, and material in the second silicon layer may be etched to define the fixed silicon electrode.

According to an exemplary embodiment, the etching of the material in the first and second silicon layers may be performed using a switched plasma etching process.

In an exemplary embodiment, the present invention may provide a method of fabricating a micromechanical device having improved performance characteristics. According to the method, gaps between components in the micromechanical elements may be reduced by either depositing or growing a sacrificial layer between the components and then removing the sacrificial layer, thereby generating nanogaps between the components.

According to an exemplary embodiment, the sacrificial layer may be released by exposing the micromechanical element to liquid HF acid or to HF vapor.

According to an exemplary embodiment, the nanogaps may be about 50 nanometers in width.

In an exemplary embodiment, the present invention provides a variable capacitive element having a fixed, vertically-inclined electrode and a movable, vertically-inclined electrode produced by arranging a sacrificial layer between the fixed electrode and the movable electrode, and etching the sacrificial layer between the fixed electrode and the movable electrode by exposing the variable capacitive element to liquid HF acid or vapor HF.

In an exemplary embodiment, the present invention provides a variable capacitive element having a fixed vertically-inclined electrode and a movable vertically-inclined electrode. The element is produced by arranging a sacrificial layer between the fixed electrode and the movable electrode having a thickness of between 10 and 1000 nanometers, and then releasing the sacrificial layer. The fixed electrode and the movable electrode are made from silicon.

DETAILED DESCRIPTION

Figure 1A:
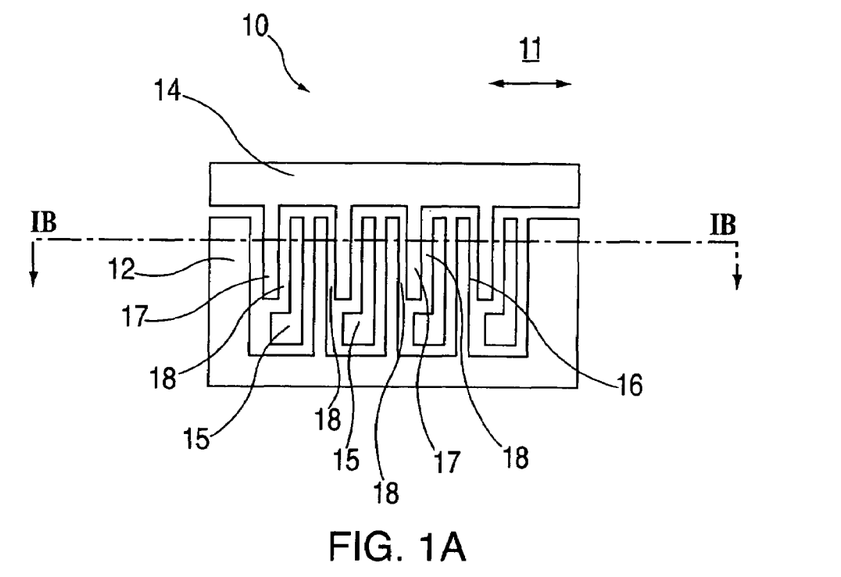
FIG. 1A shows a plan view of an exemplary variable capacitive element without a nanogap.

FIG. 1A shows an exemplary variable capacitive element 10. The particular drive configuration depicted is exemplary and the following discussion may apply equally to many variable capacitive structures having a movable electrode and fixed electrodes in a cooperative arrangement, in many configurations. The depicted variable capacitive element 10 includes fixed electrodes 12 and 15 and a movable electrode 14, each having numerous respective interdigitated fingers 15, 16, 17 which extend vertically upwards and downwards, respectively. The movable electrode 14 is free to move with respect to the fixed electrodes 12, 15, 16 in the direction of arrow 11. At equilibrium, the fingers 15 and 16 of the fixed electrodes are separated from the fingers 17 of the movable electrode by gaps 18 with equilibrium gap distances $x_0$. As the movable electrode 14 is displaced a distance x from equilibrium with respect to the fixed electrode 12, the capacitances (C) of the arrangement changes. In this manner, the change in capacitances caused by movement may be transduced into an electrical signal that may be related to the magnitude of the displacement (x). The gap distance $x_0$ may be the predominant factor in comparison to the displacement x in the inter-electrode distance, and thus, the gap distance may be a significant factor in determining the sensitivity of the variable capacitive element to relative motion. More specifically, detection sensitivity may be maximized by minimizing the equilibrium gap distance $x_0$.

A variable capacitive element similar to the element depicted in FIG. 1A may be used as an actuator to transduce an electrical signal into a physical displacement of the movable electrode. The electrostatic force between electrodes for a given voltage also increases as the equilibrium gap distance is reduced.

Figure 1B:
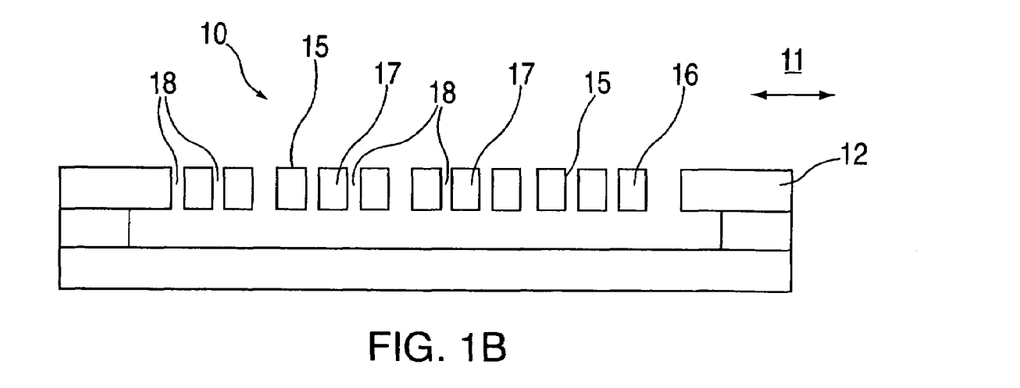
FIG. 1B shows a cross-section of the variable capacitive element shown in FIG. 1A cut along line IB—IB.

FIG. 1B shows a cross-section of the variable capacitive element of FIG. 1A cut along line IB—IB. FIG. 1B shows variable capacitive element 10 having capacitive elements 15 of fixed electrodes 12 and capacitive elements 17 of a movable electrode. Gaps 18 between capacitive elements 15, 16, 17 defines an equilibrium gap distance which affects the capacitance of variable capacitive element 10.

Figure 2A:
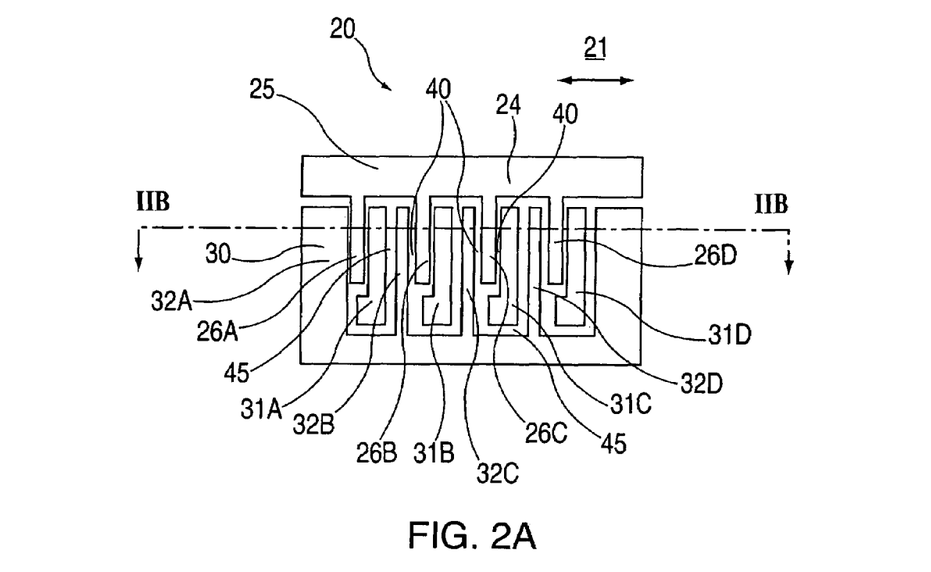
FIG. 2A shows a plan view of an exemplary embodiment of a variable capacitive element having interelectrode gaps (nanogaps) according to the present invention.

FIG. 2A illustrates a cross section of an exemplary embodiment of a variable capacitive element having interelectrode nanogaps according to the present invention. As shown, the variable capacitive element 20 includes a movable electrode 25 having a flat portion 24 and fingers e.g., 26A, 26B, 26C, 26D which extend downwards, in parallel, from the flat portion 24. It is noted that multiple fingers are not a required feature, and that the principles herein apply equally to variable capacitive elements that do not include multiple, interdigitated fingers and contain only a single electrode pair. In the embodiment depicted, each of the fingers 26A, 26B, 26C, 26D of the movable electrode 25 may be considered a separate electrode in that each finger provides a separate surface. The movable electrode 25 may be made from silicon, and according to a particular implementation, may be made from polysilicon. The counter-electrode of the variable capacitive element 20 is a fixed electrode 30 that is fixed in position with respect to a larger structure of which the capacitive element 20 is a part. The fixed electrode 30 may also be composed of silicon, and according to a particular implementation, may be made from epipoly on oxide or single crystal silicon on an insulator layer, for example an SOI (Silicon On Insulator) wafer. The fixed electrode 30 includes fingers 31A, 31B, 31C, 31D and 32A, 32B, 32C, 32D which extend upward and interdigitate with the downwardly extending fingers 26A, 26B, 26C of the movable electrode 25. Trenches 45 are situated between the fingers 31A, 31B, 31C and 32B, 32C, 32D of the fixed electrode. In the embodiment depicted, the plurality of interdigitated fingers provide a multi-segment capacitor increasing the overall capacitance of the element, with each pair of movable-fixed fingers (e.g., 26A/31A) representing a single capacitor. The fixed electrode fingers 31A, 31B, 31C are physically attached to one or more supporting structures, and the movable electrode may be movably anchored to a further anchoring structure.

Movable electrode 25 moves laterally back and forth from an equilibrium position in the direction of arrow 21. The degree of lateral movement is limited by the stiffness of the components, and the width of the nanogap 40 between the pairs of interdigitated electrodes. As will be described further below, the nanogap width may be approximately 1 to 1000 nanometers.

Figure 2B:
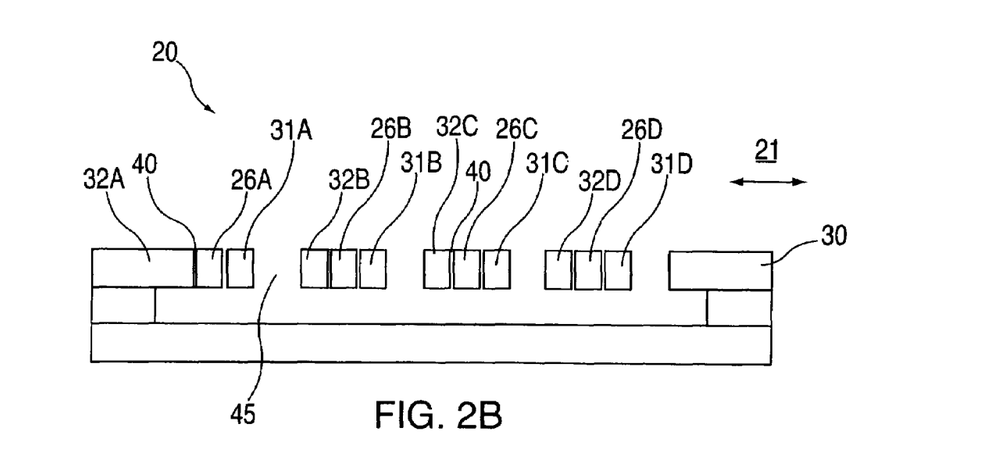
FIG. 2B shows the variable capacitive element shown in FIG. 2A cut along line IIB—IIB.

FIG. 2B shows a cross-section of the variable capacitive element of FIG. 2A cut along line IIB—IIB. FIG. 2B shows variable capacitor element 20 including a fixed electrode 30 having fingers 32A, 32B, 32C, 31D and 31A, 31B, 31C, 31D. The variable capacitive element 20 also includes a movable electrode having fingers 26A, 26B, 26C, 26D. Matching pairs of interdigitated fingers (e.g., 26A/31A) are separated by a nanogap 40, while adjacent pairs of interdigitated fingers are separated by a trench 45.

Figure 3A:
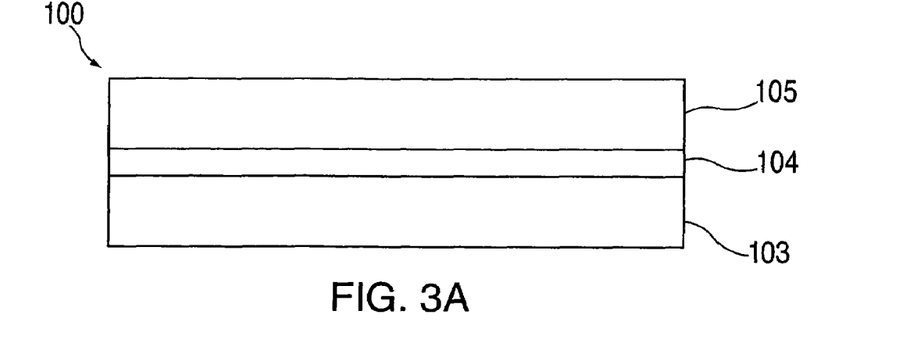
FIG. 3A is a cross section of a variable capactive element at the starting point of the fabrication process according to an exemplary embodiment of the present invention.

An embodiment of a process for fabricating variable capacitive elements having nanogaps according to the present invention is described with reference to FIGS. 3A, 3B, and 3C and FIGS. 4A, 4B, and 4C. FIG. 3A, which depicts the starting point of the fabrication process, shows an initial structure of a capacitive element 100 having three layers 103, 104, 105 from bottom to top. Layer 105 (hereinafter, the epipoly layer) may be either epipoly or single crystal silicon and may be between, for example, 10 and 30 μm in depth, and the underlying insulating layer 104 may be composed of silicon dioxide having a depth of, for example, approximately 2 μm. The bottom layer 103 is a silicon wafer substrate.

Figure 3B:
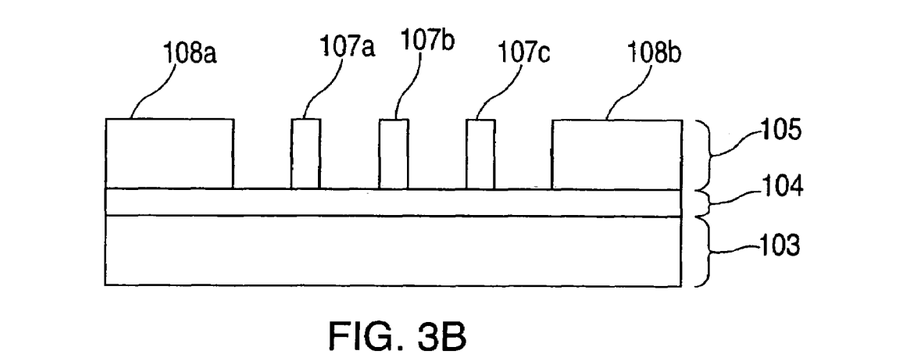
FIG. 3B is a cross section of a variable capactive element after a first set of electrodes have been formed according to an exemplary embodiment of the present invention.

The first fabrication procedure is the etching of a set of fingers, e.g. 107a, 107b, 107c in the epipoly layer 105, as shown in FIG. 3B. The etching may be performed using conventional photolithography techniques which may include spinning a photoresist mask layer over the epipoly layer 105, exposing portions of the photoresist layer to ultraviolet radiation according to a desired pattern, developing the photoresist (thereby removing a portion of the photoresist material, the remaining portion being a mask pattern protecting regions of the epipoly layer 105 from exposure) and then employing a reactive ion etching procedure to remove exposed material in the epipoly layer down to the insulating layer 104, (which is resistant to the reactive ion etchant). The photoresist layer may then be stripped using a Piranha solution or by an $O_2$ plasma. The protected material in the epipoly layer 105 form fingers 107a, b, c and ends 108a, b of the capacitive element. The fingers 107a, b, c and ends 108a, b, may form a first set of electrode elements for either a fixed or movable electrode in the final capacitive element structure.

Figure 3C:
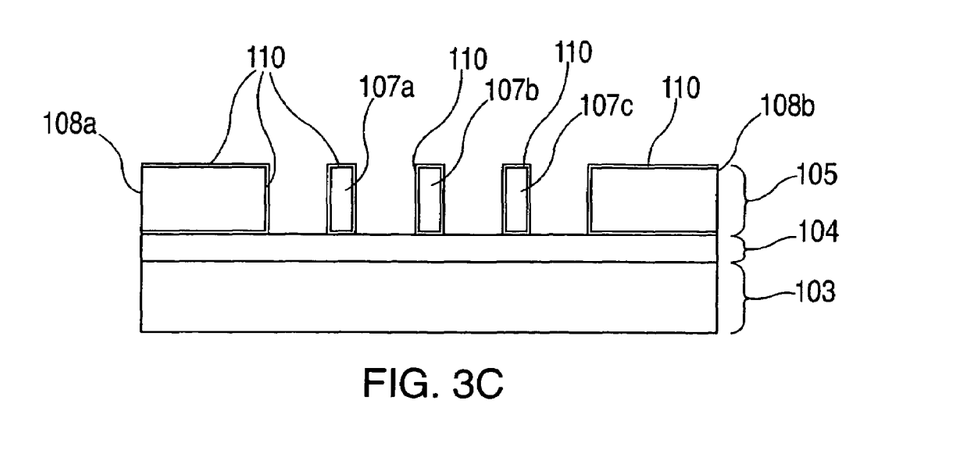
FIG. 3C is a cross section of a variable capactive element after a sacrificial oxide layer is deposited over the element shown in FIG. 3B, according to an exemplary embodiment of the present invention.

After etching, the sidewalls of the fingers 107a, b, c, the sacrificial spacer layer 110, which may typically be $SiO_2$, may be grown or deposited on the top surfaces and sidewalls of the fingers 107a, b, c, and ends 108a, b. This sacrificial layer 110 is shown in FIG. 3C. The thickness of the sacrificial layer 110 defines the nanogap width because this layer is later removed from the final capacitive element structure, creating the nanogaps 120a, 120b, 120c, 120d (shown in FIG. 4C). As noted, the thickness of the sacrificial layer 110 is limited by the minimum width of an oxide layer that can be both predictably grown on the surfaces of the electrode elements and etched away. It may also be limited by the mechanical stability of the element. This width may vary between, for example, approximately 1 and 1000 nanometers.

Figure 4A:
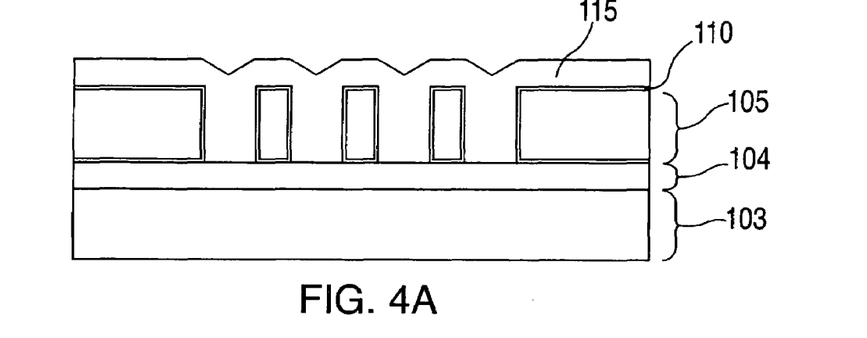
FIG. 4A is a cross section of a variable capactive element after a polysilicon layer is deposited over the sacrificial oxide layer according to an exemplary embodiment of the present invention.

As shown in FIG. 4A, a thick, conformal, polysilicon layer 115 is deposited over the sacrificial layer 110. This can be epipoly, but may also be LPCVD tube polysilicon. In the deposition process, a seed poly layer (not shown) of approximately 10–1000 nm thickness may be deposited directly over the sacrificial layer 110, over which epipoly may be deposited in an epitaxial reactor up to tens of microns in thickness to generate the bulk of the polysilicon layer 115.

Figure 4B:
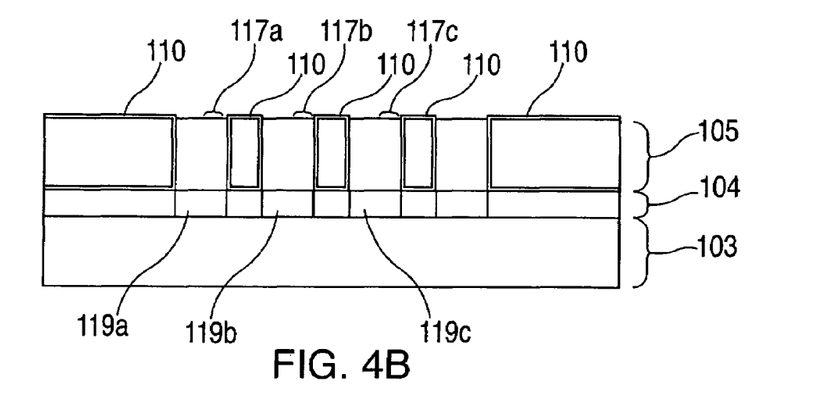
FIG. 4B is a cross section of a variable capactive element after the polysilicon layer is planarized down to the layer of the first set of electrodes according to an exemplary embodiment of the present invention.

As shown in FIG. 4B, the surface of the polysilicon layer 115 may be planarized down to the level of the top of the epipoly fingers 107a, b, c and ends 108a, b using a Chemical Mechanical Planarization (CMP) process, or by any similar process. The deposited and planarized polysilicon may be patterned and etched using a similar photolithography process to that described above. In particular, an etch mask 117a, b, c may be deposited on the surface to define a second set of finger electrodes (116a, b, c shown in FIG. 4C). The top surface and sidewall oxide on the first set of electrodes normally protects them from etching, therefore the etch mask may or may not overlap the existing structures. The gaps between the first and second sets of electrodes (i.e., the distance between 107a/116a and 107b/116b) may typically be the same width as would be formed between etched electrodes, e.g., on the order of a micron.

The sacrificial layer 110 separates the first and second electrodes (e.g., 107a and 116a) and must be cleared from the nanogap. According to an exemplary embodiment, the sacrificial oxide layer may be removed with liquid HF acid or HF vapor etch. Other appropriate etching methods may also be used.

Figure 4C:
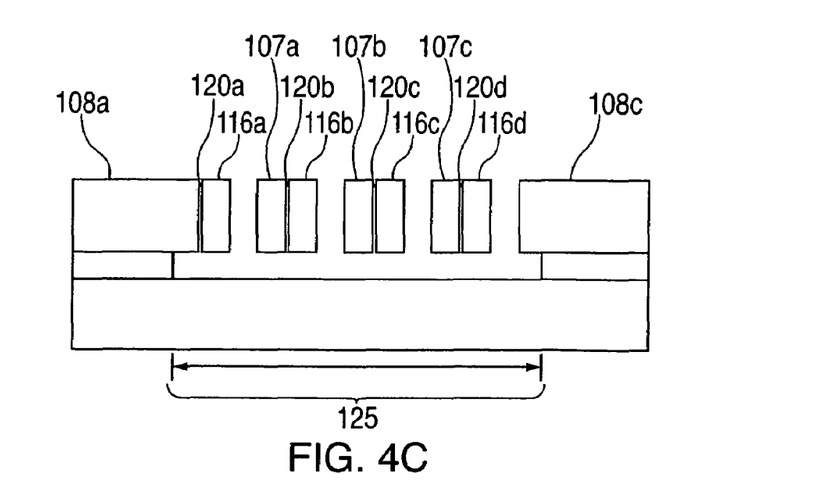
FIG. 4C is a cross section of a variable capactive element at a final point of the fabrication process according to an exemplary embodiment of the present invention in which a second set of electrodes is formed and the sacrificial oxide layer has been removed.

FIG. 4C shows the final stage of the fabrication process according to the present invention. Either the first set 107a, b, c or the second set 116a, b, c of electrodes can be the movable structures. For instance, if the element is built in single crystal silicon then the first set of electrodes is typically single crystal silicon and the second set will typically be epipoly. In this case, the single crystal silicon would generally be used for the movable electrode structure. However, when both electrodes are of the same material, it may be more convenient to use the first set as the fixed electrodes since the large field areas are natural anchors. In addition, the first electrodes 107a, b, c and the second electrodes 116a, b, c may be attached in some areas. If a step is inserted into the process to clear the sidewall oxide on selected areas of the first electrodes prior to the second electrode deposition, then the second electrode may be bonded to the first in those areas. This has the benefits that the bonded second electrodes do not need large support anchors to the substrate and they may have electrical contacts to areas of the first electrode.

There may be several advantages to the variable capacitive element having inter-electrode nanogaps according to the present invention. Because of the increased sensitivity that variable capacitive elements with nanogaps provide, signals from sensors made from capacitive elements are larger. For example, for sensors the capacitive signal varies inversely with the square of the gap width for lateral motion. Therefore, a ten-fold reduction in gap width can result in an increase of approximately 100 times in signal amplitude. Since many sensors may be limited by their signal-to-noise ratio, the increased signal may translate into increased sensor resolution.

When increased resolution is not needed, the decreased gap may allow for reduction in capacitor area. Thus, a ten-fold reduction in gap width can support a 100 fold reduction in interdigitated electrode area. Since the majority of active sensor area is usually dedicated to capacitor electrode structures, this may translate into a significant reduction in sensor area and cost. The decreased inter-electrode gap width may also simplify sensor circuitry.

The analog front ends used in capacitance sensing are often difficult to design and expensive to manufacture. Their performance often limits the entire sensor. Increased sensor capacitance can simplify and unburden the amplifier circuitry.

In a similar vein, the reduced gap width may eliminate charge pumps. Charge pumps are used to increase the voltages across the capacitors. With increased capacitance, the variable capacitive elements according to the present invention can maintain the same performance at lower voltage levels. When capacitors are used as driving transducers, narrow gaps can significantly increase the force per volt of drive. This again provides for lower drive voltages and smaller areas.

As discussed above, conventional lithographic techniques for defining gap widths are limited to quarter micron resolution for common stepper equipment, and even the most extreme lithography equipment today can only define one-tenth micron resolution. The limits of the width of the thin sacrificial layer which determines the nanogap widths are set by device distortion and surface quality, but are nevertheless much finer than lithography limits. Even as lithography technology progresses, the sacrificial method described here will generally enable narrower gaps. Along the same lines, etching constraints preclude cutting capacitor gaps with extremely tall and narrow profiles, known as high aspect ratios. The aspect ratios achievable according to the present invention are not limited in this way and can support very high aspect-ratio gaps, for instance to the hundreds.

Furthermore, very predictable nanogap widths can be produced according to the present invention as the conditions for the growth of the sacrificial oxide layer are adjustable, with tight design tolerances achievable. Consequently, when the sacrificial layer is composed of a conformal oxide, the nanogaps formed provide gap spacings that can be more uniform across a given variable capacitive element or across a plurality of variable capacitive elements than etched gap spacings. Significantly, gap uniformity among a number of sensor devices can be an important factor in determining sensitivity uniformity among the devices, and improvements in sensitivity uniformity among different devices can reduce calibration requirements and save additional cost.

Figure 5:
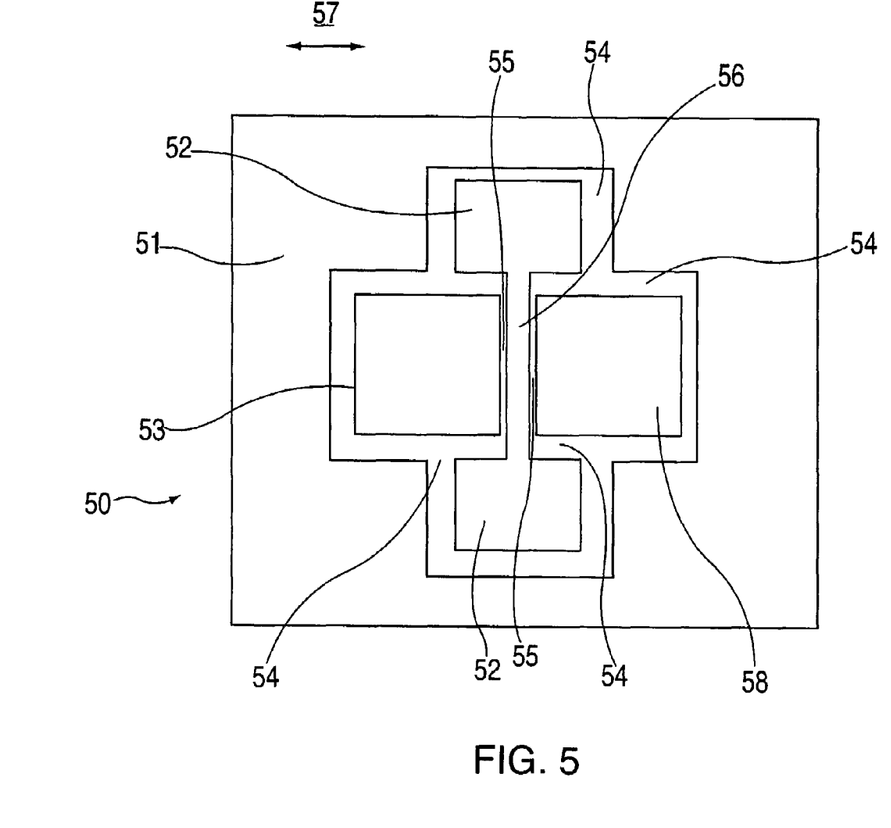
FIG. 5 is a plan view of a resonator using a nanogap.

FIG. 5 shows a resonator fabricated using a nanogap. Resonator 50 is fabricated on substrate 51. Fixed supports 52 support bridge 56, which is a resonating structure able to vibrate at least in the direction of arrow 57. Supports 52 and bridge 56 are constructed of a first material. Driver 53 and pickup 58 are situated on opposite sides of bridge 56, are separated from bridge 56 by nanogap 55, and are constructed of a second material. Supports 52, bridge 56, driver 53 and pickup 58 are separated from substrate 51 by trench 54. Resonator 50 may be operated by imposing an oscillating voltage between driver 53 and bridge 56. This oscillating voltage may induce bridge 56 to vibrate in the direction of arrow 57. The vibration of bridge 56 may be measured at pickup 58 by measuring the oscillating voltage or current between bridge 56 and pickup 58. Resonator 50 may be operated at frequencies, for example, between 10 and 100 megahertz.

In the foregoing description, the method and system of the present invention have been described with reference to a number of examples that are not to be considered limiting. Rather, it is to be understood and expected that variations in the principles of the method and apparatus herein disclosed may be made by one skilled in the art. It is intended that such modifications, changes, and/or substitutions are to be included within the scope of the present invention as set forth in the appended claims. Thus, to the extent that the performance of such devices can be improved by reducing the gaps between the component structures of such micromechanical elements, the principles of the present invention are intended to be equally applicable with respect to such elements. In particular, the principles of the present invention are intended to be applicable to reducing inter-component gaps between silicon components in micromechanical devices. Additionally, all references to silicon and polysilicon may include doped silicon or doped polysilicon, including Silicon/Germanium. Other doping combinations are also possible.

What is claimed is:

1. A method for fabricating a variable capacitive device, comprising:
   providing a first silicon-bearing electrode on a substrate;
   providing a sacrificial layer on the first silicon-bearing electrode, the sacrificial layer being vertically-inclined with respect to the substrate;
   providing a second silicon-bearing electrode on the sacrificial layer;
   removing the sacrificial layer from between the first silicon-bearing electrode and the second silicon-bearing electrode;
   depositing epipoly to form a first silicon-bearing layer;
   etching the first silicon-bearing layer to define the first silicon-bearing electrode;
   depositing epipoly to form a second silicon-bearing layer on the sacrificial layer; and
   etching the second silicon-bearing layer to define the second silicon-bearing electrode;
   before the etching of the second silicon-bearing layer, planarizing the second silicon-bearing layer down to a level of the first silicon-bearing electrode,
   wherein at least one of the first and second silicon-bearing electrodes is a movable electrode;
   wherein the first silicon-bearing electrode is electrically insulated from the second silicon-bearing electrode.

2. The method of claim 1, wherein the planarizing includes a chemical mechanical planarization process.

3. The method of claim 1, wherein the first silicon-bearing electrode is vertically-inclined with respect to the substrate.

4. The method of claim 3, wherein the second silicon-bearing electrode is about parallel to the first silicon-bearing electrode.

5. The method of claim 1, wherein the second silicon-bearing electrode is vertically-inclined with respect to the substrate.

6. The method of claim 1, wherein the first silicon-bearing electrode is the movable electrode and the second silicon-bearing electrode is the fixed electrode.

7. The method of claim 1, wherein the second silicon-bearing electrode is the movable electrode and the first silicon-bearing electrode is the fixed electrode.

8. The method of claim 1, wherein at least one of the first silicon-bearing electrode and the second silicon-bearing electrode, includes epitaxially deposited polysilicon.

9. The method of claim 1, wherein the sacrificial layer is deposited by high temperature oxidation.

10. The method of claim 1, wherein the sacrificial layer is deposited in a highly conformal depositional process.

11. The method of claim 1, wherein a nanogap of less than 100 nanometers wide is generated between the first silicon-bearing electrode and the second silicon-bearing electrode.

12. A method for fabricating a variable capacitive device, comprising:
    providing a first silicon-bearing electrode on a substrate;
    applying a sacrificial layer directly on the first silicon-bearing electrode, the sacrificial layer being applied in a vertically-inclined manner with respect to the substrate;
    providing a second silicon-bearing electrode directly on the sacrificial layer; and
    removing the sacrificial layer from between the first silicon-bearing electrode and the second silicon-bearing electrode;
    wherein at least one of the first and second silicon-bearing electrodes is a movable electrode;
    wherein the providing of the first silicon-bearing electrode further includes depositing epipoly to form a first silicon-bearing layer and etching the first silicon-bearing layer to define the first silicon-bearing electrode; and
    wherein the providing of the second silicon-bearing electrode further includes:
        depositing epipoly to form a second silicon-bearing layer on the sacrificial layer;
        etching the second silicon-bearing layer to define the second silicon-bearing electrode; and
        before the etching of the second silicon-bearing layer, planarizing the second silicon-bearing layer down to a level of the first silicon-bearing electrode.

13. The method of claim 12, wherein the planarizing includes a chemical mechanical planarization process.

14. The method of claim 12, wherein the providing of the sacrificial layer on the first silicon-bearing electrode includes at least one of:
    growing the sacrificial layer in a thermal oxide growth process; and
    depositing the sacrificial layer in a chemical vapor deposition process.

15. The method of claim 12, wherein the sacrificial layer is deposited in a conformal depositional process.

16. The method of claim 12, further comprising sealing the variable capacitive device in an encapsulation of epipoly.

17. The method of claim 12, wherein the first silicon-bearing electrode includes polysilicon.

18. The method of claim 12, wherein the second silicon-bearing electrode includes polysilicon.

19. The method of claim 12, wherein the sacrificial layer includes silicon dioxide.

20. The method of claim 12, wherein the first silicon-bearing electrode is vertically-inclined with respect to the substrate.

21. The method of claim 20, wherein the second silicon-bearing electrode is about parallel to the first silicon-bearing electrode.

22. The method of claim 12, wherein the second silicon-bearing electrode is vertically-inclined with respect to the substrate.

23. The method of claim 12, wherein the other of the first and second silicon-bearing electrodes is a further movable electrode, the movable electrode and the further movable electrode movable at least one of towards and away from each other.

24. The method of claim 12, wherein the other of the first and second silicon-bearing electrodes is a fixed electrode, the movable electrode movable at least one of towards and away from the fixed electrode.

25. The method of claim 24, wherein the first silicon-bearing electrode is the movable electrode and the second silicon-bearing electrode is the fixed electrode.

26. The method of claim 24, wherein the first silicon-bearing electrode is the fixed electrode and the second silicon-bearing electrode is the movable electrode.

27. The method of claim 12, wherein the providing of the second silicon-bearing electrode includes at least one of:
    depositing in an epitaxial reactor environment;
    sputtering;
    evaporating; and
    chemical vapor deposition.

28. The method of claim 12, wherein a capacitance of the variable capacitive device is maximally dependent on a horizontal motion of the movable electrode.

* * * * *